United States Patent
Yamagishi

[11] Patent Number: 6,083,013
[45] Date of Patent: Jul. 4, 2000

[54] IC SOCKET

[75] Inventor: Hiroki Yamagishi, Kawagoe, Japan

[73] Assignee: Enplas Corporation, Saitama, Japan

[21] Appl. No.: 08/890,314

[22] Filed: Jul. 9, 1997

[51] Int. Cl.$^7$ ................................................ H01R 9/09
[52] U.S. Cl. .............................. 439/71; 439/66; 439/331
[58] Field of Search ................................. 439/70–73, 66, 439/266

[56] References Cited

U.S. PATENT DOCUMENTS

| | | | |
|---|---|---|---|
| 5,247,250 | 9/1993 | Rios | 439/70 |
| 5,248,262 | 9/1993 | Busacco et al. | 439/66 |
| 5,376,010 | 12/1994 | Petersen | 439/266 |
| 5,518,410 | 5/1996 | Masami | 439/71 |
| 5,865,639 | 2/1999 | Fuchigami et al. | 439/266 |

FOREIGN PATENT DOCUMENTS

| | | |
|---|---|---|
| 6-203926 | 3/1991 | Japan . |
| 6-89764 | 7/1994 | Japan . |

*Primary Examiner*—Neil Abrams
*Attorney, Agent, or Firm*—Fish & Richardson P.C.

[57] ABSTRACT

An IC socket includes a socket body (1) for supporting lower end sections of bow-shaped contact pins (3), a floating member (2) provided with holes (2a) for guiding upper end sections of the contact pins (3), and a cover member (4) for pressing the floating member. Borders of the guide holes (2a) act as stoppers for the upper end sections of the contact pins (3) for regulating height of projection thereof from the floating member (2) and contact positions thereof in reference to solder ball terminals to prevent damage to the solder ball terminals of the IC package even if the solder balls are softened under a heat-resistance test or the like. In one embodiment, the IC socket can effectively perform wiping of the solder balls when it is used at an ordinary temperature. The cover member (4) may be used and formed with a surface (4b) for first engaging the IC package and another surface (4a) for subsequently engaging the top surface of the floating member (2). The lower end sections of the contact pins (3) may be fixed in the socket body (1) or may be movably supported

7 Claims, 6 Drawing Sheets

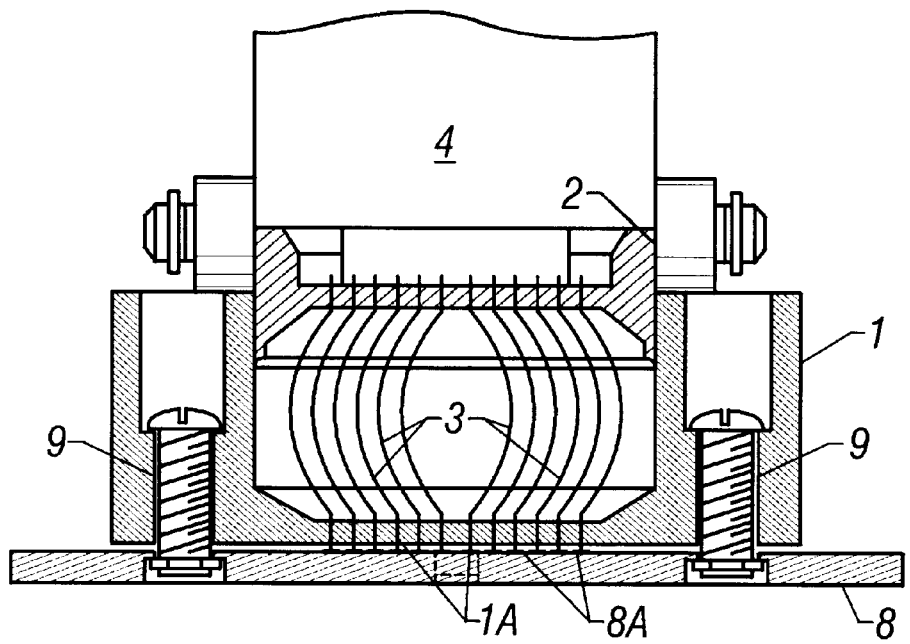
FIG. 2
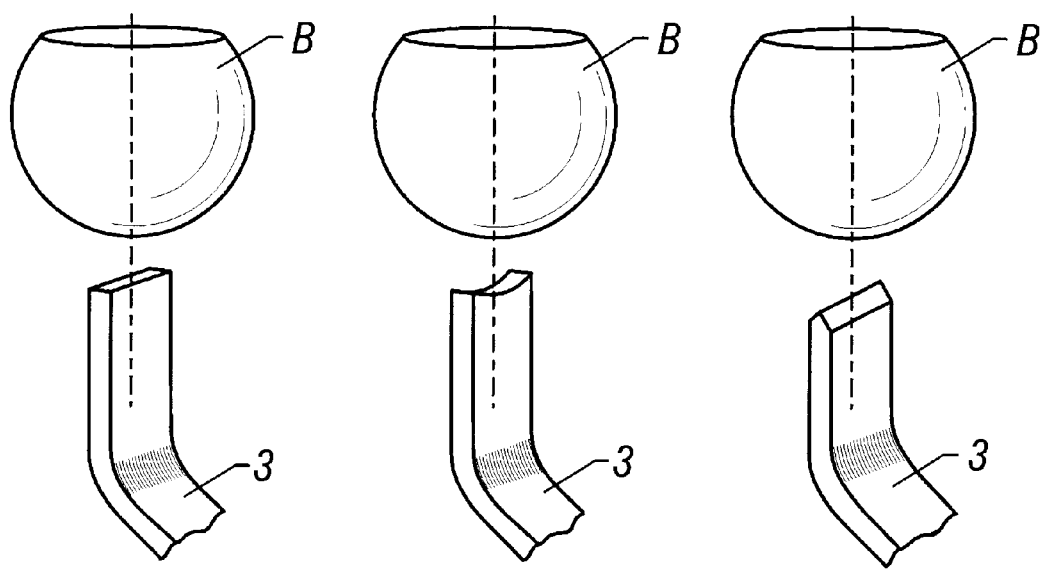
FIG. 5A  FIG. 5B  FIG. 5C

IC SOCKET

BACKGROUND OF THE INVENTION a) Field of the Invention

The present invention relates to an IC socket compatible with CSP (chip-sized package) or BGA (ball grid array) type IC packages, specifically to that preferably used for a burn-in test.

b) Description of the Related Art

For sockets for CSP or BGA type IC packages, various structures have been proposed (refer to Japanese Patent Preliminary Publication Nos. Hei 6-89764, Hei 6-203926, for example). In general. in a BGA type IC package, bumps which protrude from the lower surface of the package body are hemispherically or spherically shaped out of a low-melting-point metal such as a solder material. Therefore, when such an IC package is subjected to a heat-resistance test (125° C.–150° C.) or the like while being mounted on an IC socket, the solder balls, which are softened by heat, are deformed due to contact force between the solder balls and contact pins of the IC socket, to lose their coplanarlity, and thus would cause a problem when the package is mounted on a printed circuit board for practical use. It is required for an IC socket, other than to solve this problem, to effectively rub its contact pins against the solder balls of the IC package (i.e. to perform "wiping" operation) for assuring electrical connection with minimum contact resistance.

SUMMARY OF THE INVENTION

Therefore, an object of the present invention is to provide an IC socket which can maintain coplanarlity of solder balls of a BGA type IC package even when the IC package mounted thereon is subjected to a heat-resistance test and which assures effective wiping of the solder balls of the IC package mounted thereon for practical use under the ordinary temperature condition.

To attain this object, an IC socket according to the present invention includes a socket body by which lower end sections of a multitude of elastic contact pins set in array are movably supported, a floating member which is vertically movably held above the socket body and by which upper end sections of the contact pins are movably supported, and a cover member which is constructed to be fitted to the floating member for pressing the same toward the socket body, wherein the floating member is provided with a guide section for regulating projecting height of the upper end sections of the contact pins from the floating member and with a container section for containing the IC package to bring a multitude of ball terminals of the IC package into contact with their respective mate contact pins, and wherein where the cover member is fitted to the floating member to press it toward the socket body upon the IC package being put in the container section, contact at predetermined pressure is obtained between the lower end sections of the contact pins and electrodes of a printed circuit board and between the upper end sections of the contact pins and the terminals of the IC package, respectively.

Also, according to the present invention, an IC socket includes a socket body by which lower end sections of a multitude of elastic contact pins set in array are fixedly supported, a floating member which is vertically movably held above the socket body and by which upper end sections of the contact pins are movably supported, and a cover member which is constructed to be fitted to the floating member for pressing the same toward the socket body, wherein the floating member is provided with a guide section for regulating projecting height of the upper end sections of the contact pins from the floating member, and with a container section for containing the IC package to bring a multitude of ball terminals of the IC package into contact with their respective mate contact pins, and wherein where the cover member is fitted to the floating member to press it toward the socket body upon the IC package being put in the container section, the upper end sections of the contact pins are contacted with and rubbed against the ball terminals of the IC package at predetermined pressure. Also, according to the present invention, a tip of the upper end section of each contact pin has an inclined face, which is to be contacted with and rubbed against a portion, exclusive of a bottom point, of the ball terminal.

Also, according to the present invention, the container section is constructed to form a recess in the floating member, and the cover member has a first surface which is to be brought into contact with the top surface of the floating member and a second surface which is to be brought into contact with the upper surface of the IC package contained in the container section, wherein when the cover member performs fitting, or closing operation, the second surface comes into contact with the upper surface of the IC package before the first surface does with the top surface of the floating member.

Also, according to the present invention, the guide means of the floating member are constructed and arranged such that the upper end section of each contact pin is directed toward a center of its mate solder ball, which is an individual terminal of the IC package.

Also, according to the present invention, a tip of the upper end section of each contact pin has at least one face which is inclined with respect to a longitudinal direction of the contact pin.

This and other objects as well as the features and the advantages of the present invention will become apparent from the following detailed description of the preferred embodiments when taken in conjunction with the accompanying drawings.

BRIEF DESCRIPTION OF THE DRAWINGS

FIGS. 2 is a transverse sectional view of the IC socket shown in FIG. 1A;

FIGS. 5A, 5B, 5C are perspective views for showing typical examples of contact pins different from one another in tip shape of the upper end sections thereof;

DETAILED DESCRIPTION OF THE PREFERRED EMBODIMENTS

Figure 1:
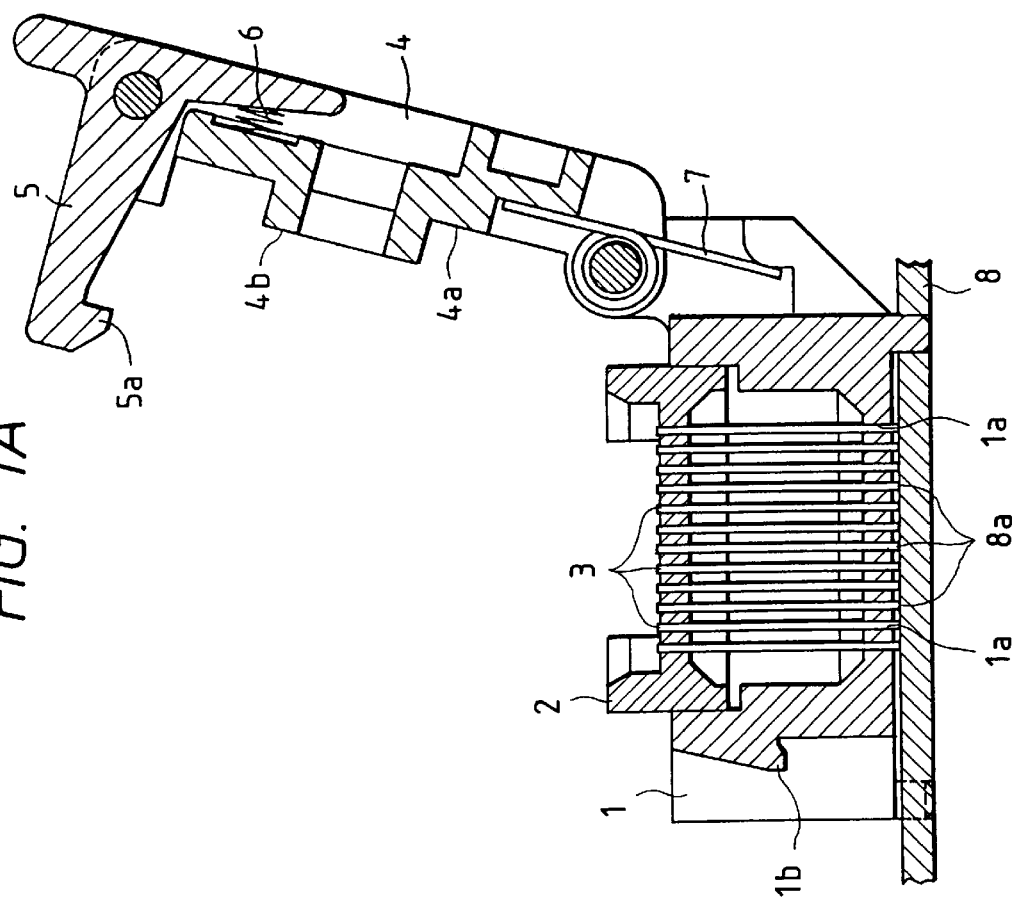
FIG. 1A is a central longitudinal sectional view showing an IC socket, which is in an open-cover position, according to a first embodiment of the present invention.
FIG. 1B is a central longitudinal sectional view showing a modification example of a cover section of the IC socket shown in FIG. 1A.

The aspects of the present invention will be described as follows based on embodiments shown in the drawings.

As shown in FIGS. 1A, 2, 3A–3D, an IC socket according to a first embodiment of the present invention includes: a socket body 1 of an electrically insulating synthetic resin or the like having a rectangular contour as viewed from the top, the socket body being provided with a multitude of holes 1a in a bottom section thereof and a hooked portion 1b; a floating member 2 of an electrically insulating synthetic resin or the like vertically movably held above the socket body 1 with its upper limit position being determined by a stop mechanism not shown in the drawings, the floating member 2 being provided with a multitude of rectangular or circular guide holes 2a, which are to be paired with the holes 1a in the socket body 1, respectively, and a container section 2b which forms a recess for containing an IC package P therein; a multitude of contact pins 3 shaped from a thin plate of beryllium copper via pressing process, the contact pins 3 being movably supported by the socket body 1 with their lower end sections being inserted in the holes 1a of the socket body 1 while their upper end sections being inserted in the guide holes 2a of the floating member 2 in the movable manner; a cover member 4 pivotally mounted, at one end thereof, on the socket body 1, the cover member 4 having a first surface 4a and a second surface 4b to be contacted with a top surface of the floating member 2 and an upper surface of the IC package P, respectively, in a closed position; a lock lever 5 pivotally mounted on another end of the cover member 4 opposite to the pivotal end with respect to the socket body 1, the lock lever 5 having a hook 5a which is engageable with the hooked portion 1b of the socket body 1 for maintaining the closed-cover state; a spring 6 for urging the lock lever 5 counterclockwise on the plane of the figure; and a spring 7 for urging the cover member 4 toward the open position. The socket body 1 is fixed by fixing members 9 to a printed circuit board 8 which has a multitude of electrodes 8a. The lower end sections of the contact pins 3 abut on the electrodes 8a. Each contact pin 3 is cornered at points where the linearly shaped upper and lower end sections meet an arc-shaped middle section, respectively, such that the end sections are aligned, to assume a bow shape as a whole. As shown in FIG. 4A, each guide hole 2a is shaped such that the area of aperture thereof slightly increases as it goes from an upper side to a lower side, with a lower border 2a' thereof having a curved face, with which the upper end section of the contact pin 3 is to be slidably contacted.

In the above-described IC socket, since the contact pins 3 are set in place as slightly elastically deformed when they are combined with the socket body 1 and the floating member 3 in assembly, the floating member 2 is held at its upper limit position due to the recovering force of the contact pins 3 when it is free from external force with the cover member 4 being open. The multitude of guide holes 2 are arranged at relative positions such that the upper end section of each contact pin 3 is directed toward the center of its mate solder ball B when the IC package P is mounted on the container section 2b.

Figure 3A:
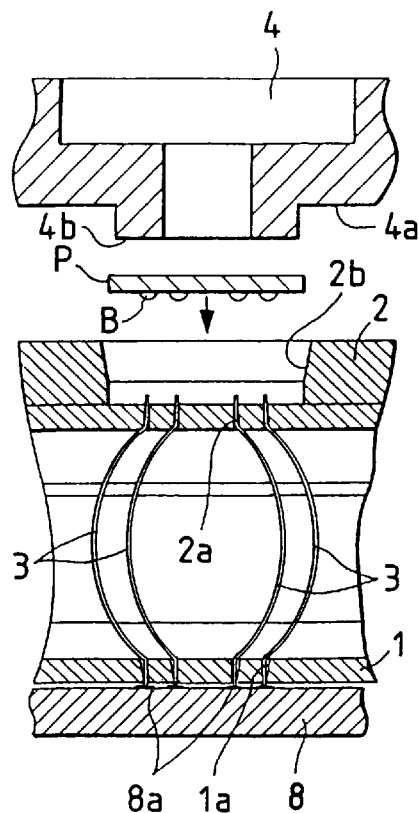
FIGS. 3A, 3B, 3C, 3D are views of the relevant portion for illustrating the function of the IC socket shown in FIG. 1A.
Figure 3B:
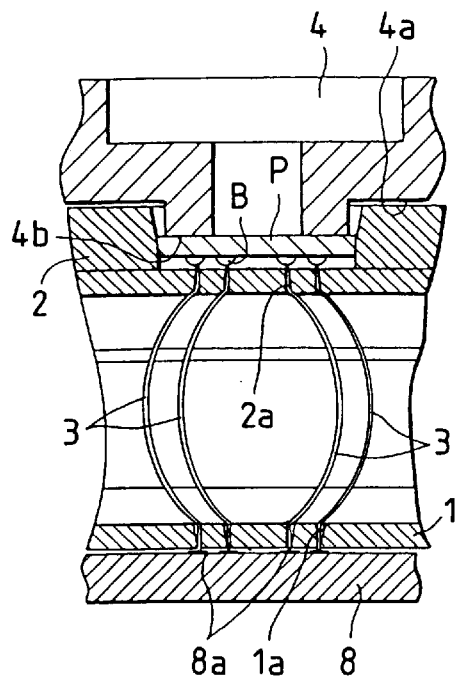
Figure 3C:
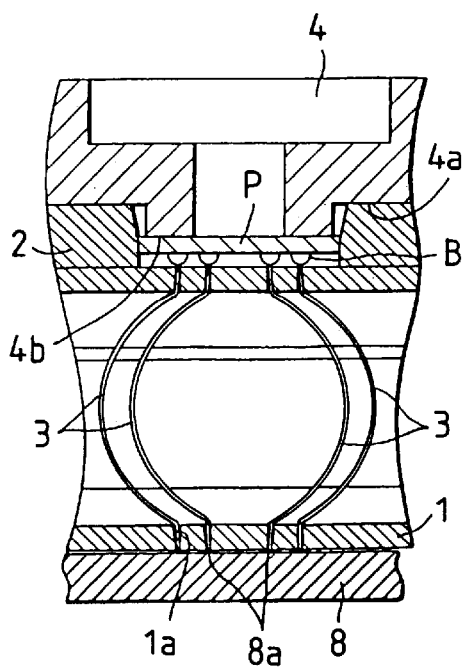
Figure 3D:
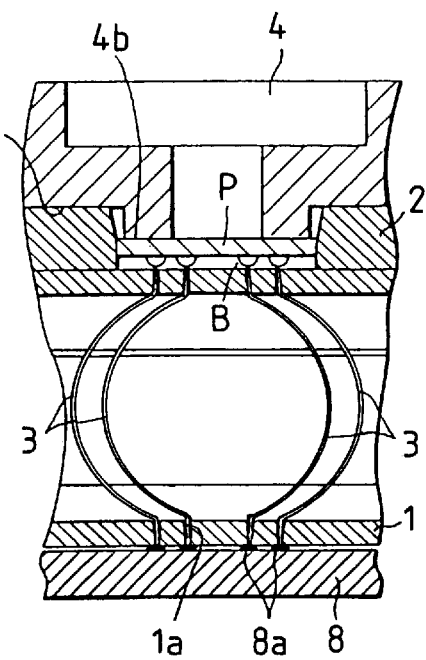
Figure 4A:
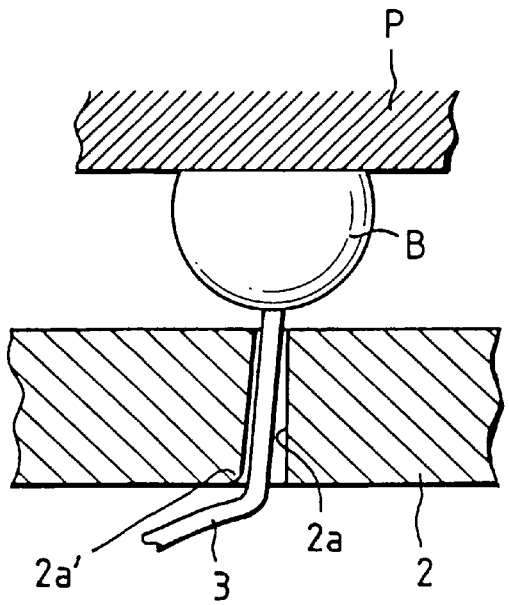
FIGS. 4A, 4B are views for showing contact states between a contact pin of the IC socket and a solder ball of an IC package under different temperature conditions, respectively.

Since the IC socket of the first embodiment is thus configured, if a BGA type IC package P with solder balls is put on the container section 2b of the IC socket in the open-cover state as shown in FIG. 3A, a bottom point of each solder ball is stopped as it kisses the tip of the upper end section of its mate contact pin 3. At this stage, if the cover member 4 starts to close, firstly the second surface 4b comes into contact with the upper surface of the IC package P while the first surface 4a has not yet been contacted with the top surface of the floating member 2 (refer to FIG. 3B). If the cover member 4 further moves to continue closing operation, as shown in FIG. 3C, the contact pins 3 are deformed to slightly increase their curvature as the first surface 4a reaches the top surface of the floating member 2. Therefore, at this stage, contact forces are somewhat generated between the tips of the lower end sections of the contact pins 3 and the electrodes 8a of the printed circuit board 8, and between the tips of the upper end sections of the contact pins 3 and the solder balls B. And then if the cover member 4 is completely closed with the hook 5a of the lock lever 5 being engaged with the hooked portion 1b of the socket body 1 for maintaining the closed-cover state, the floating member 2 is further pushed down slightly by the cover member 4 to further increase the curvature of the contact pins 3, as shown in FIG. 3D, so that predetermined contact forces are obtained between the tips of the lower end sections of the contact pins 3 and the electrodes 8a of the printed circuit board 8, and between the tips of the upper end sections of the contact pins 3 and the solder balls B. Since both the tips of each contact pin 3 are pressed while the contact pin 3 being free, the contact forces generated at the both tips are substantially equal.

Figure 4B:
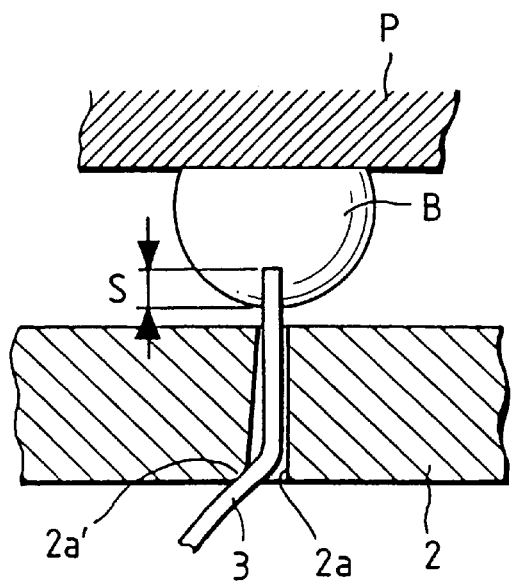
Figure 4C:
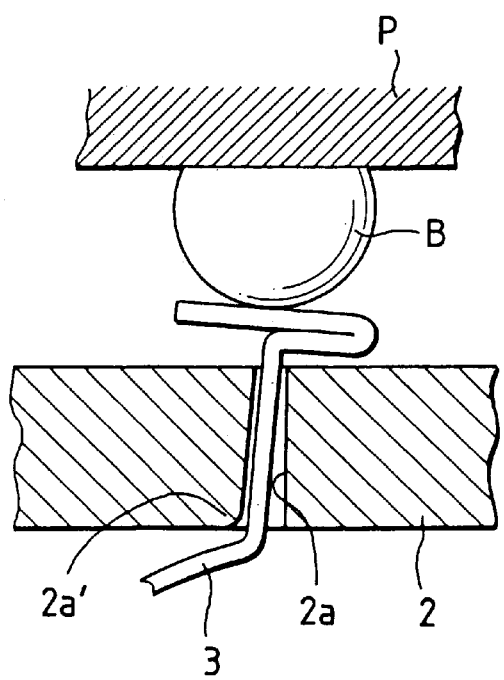
FIGS. 4C, 4D are views for showing contact states between a contact pin which is different from that shown in FIGS. 4A, 4B and a solder ball of an IC package under different temperature conditions, respectively.
Figure 4D:
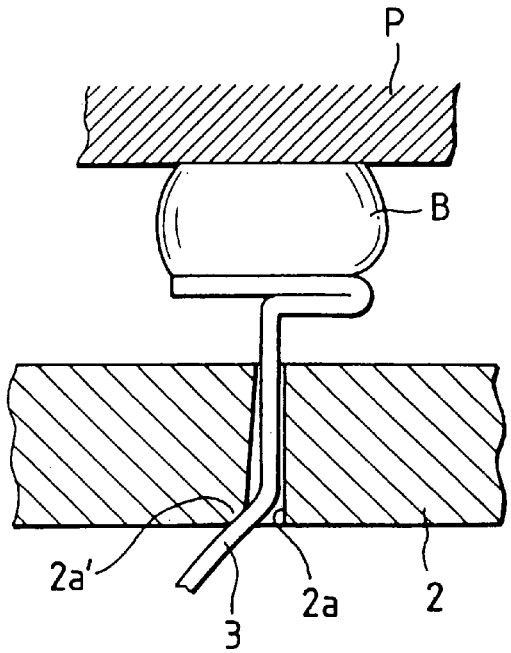

In case the test or the like of the IC package P is performed under the ordinary temperature condition, the contact force at each contact point is thus obtained by the above-described closing-cover process, with the positional relationship between each guide hole 2a and the tip of its mate contact pin 3 being maintained as shown in FIG. 4A. On the other hand, if the ambient temperature is near 150° C. as in the case of the heat-resistance test, the tip of the upper end section of the contact pin 3 cuts into the solder ball B, which is softened by the heat, as shown in FIG. 4B. In this case, however, according to the present invention, a lower border 2a' of each guide hole 2a acts as a stopper against movement of its mate contact pin 3, so that the upper end section of every contact pin 3 is forced to stop at a vertical position higher by a distance S than that at the ordinary temperature. Therefore, even if the solder balls B are hardened and remain deformed after the heat-resistance test, their coplanarity is substantially maintained (i.e. the tips of the solder balls B substantially lie on a plane), and thus a problem would not occur when the IC package is mounted in place for practical use. Furthermore, as shown in FIG. 4C, the upper end section of each contact pin 3 may be horizontally folded to form a contact portion, which is intended to be horizontally contacted with the bottom point of the solder ball B. In this case also, the lower border 2a' of each guide hole 2a in the floating member 2 acts as a stopper so that its mate solder ball B, even in the softened state, is deformed in a predetermined range such as not to cause a problem, as shown in FIG. 4B.

In the above-described first embodiment, various types of tip shape are available for the upper end section of the contact pin 3 in view of assurance of contact with the solder ball B. FIGS. 5A–5C show typical examples of the tip shape. In a test or the like under the ordinary temperature condition, a planar contact portion shown in FIG. 5A performs single-point contact, a double-edged contact portion shown in FIG. 5B performs double-point contact, and a single-edged contact portion shown in FIG. 5C performs double-point contact. When the solder ball B is softened by the heat-resistance test, these contact portions perform surface contact or linear contact, as a matter of course.

To eject the IC package P which is such mounted in place, one can turn the lock lever 5 clockwise against the force by which it is kept urged, to disengage the hook 5a from the hooked portion 1b of the socket body 1. This operation causes the cover member 4 to swing clockwise for the open position in accordance with the recovering force of the spring 7, so that the IC package P can be ejected.

Figure 6A:
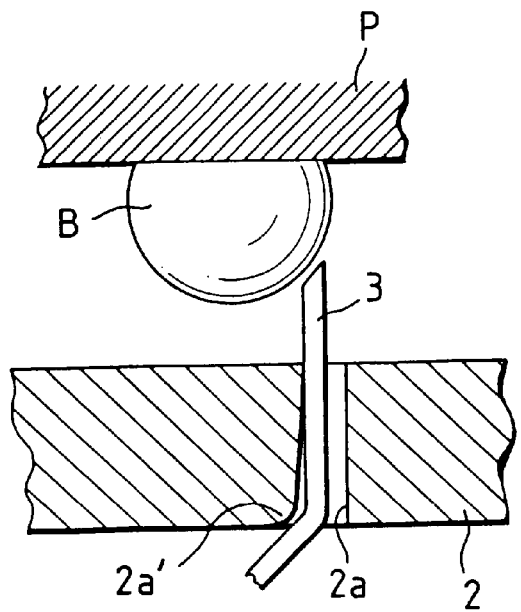
FIG. 6A is a view for showing a positional relationship between a contact pin of an IC socket according to a second embodiment of the present invention and a solder ball of an IC package where pressure is not applied.
Figure 6B:
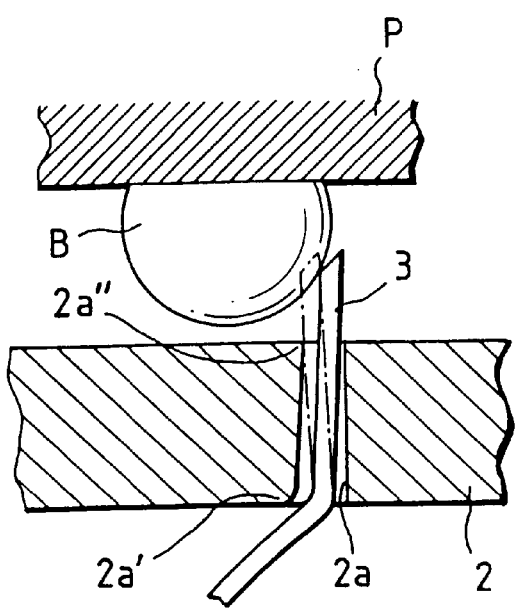
FIG. 6B is a view for showing a contact state between the contact pin of the IC socket according to the second embodiment of the present invention and the solder ball of the IC package where pressure is applied.

FIGS. 6A, 6B relate to an IC socket according to a second embodiment of the present invention, specifically showing positional relationship between a contact pin 3 of the IC socket and a solder ball B of an IC package P. FIG. 6A shows the state where the IC package P is put in a container section 2b of a floating member 2 but under no pressure, i.e. with a cover member 4 remaining open. FIG. 6B shows the state where mounting is completed with a lock lever 5 being locked upon closure of the cover member 4. The second embodiment is different from the first embodiment in that lower end sections of the contact pins 3 are fixedly supported by a socket body 1 as projecting from a bottom surface of the socket body 1 by a predetermined length and in that guide holes 2a are arrayed in a floating member 2 at positions in reference to the solder balls B such that the contact pins 3 are guided by the guide holes 2a to make themselves pressed on and rubbed against side faces of the solder balls B at tips of their upper end sections for effective wiping. Also, in the second embodiment, an upper border 2a" of each guide hole 2a in the floating member 2 acts as a stopper for regulating cut depth of the solder ball B to be in a predetermined range, as indicated by single dot & dash lines in FIG. 6B.

Thus, the second embodiment is preferably applicable to the case where an IC package P is subjected to a test or the like under the ordinary temperature condition and is effective in that the solder balls B are effectively wiped by the contact pins 3 in the closing process of the cover member 4 to assure good electrical contact. This embodiment is similar to the first embodiment in the basic configuration of the IC socket and the basic operation of the floating member 2, contact pins 3, and cover member 4 in mounting and ejecting of the IC package P, as shown in FIGS. 1A, 2, 3A–3D. Thus, descriptions in this relation are omitted here.

Figure 7:
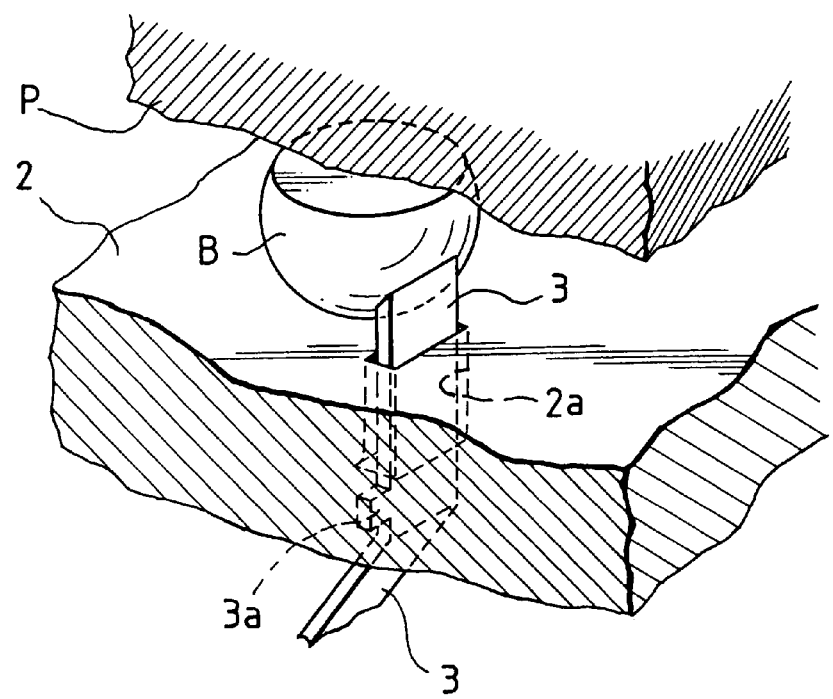
FIG. 7 is a perspective view of the relevant portion for showing a positional relationship between a contact pin of an IC socket according to a third embodiment of the present invention and a solder ball of an IC package where pressure is not applied.
Figure 8:
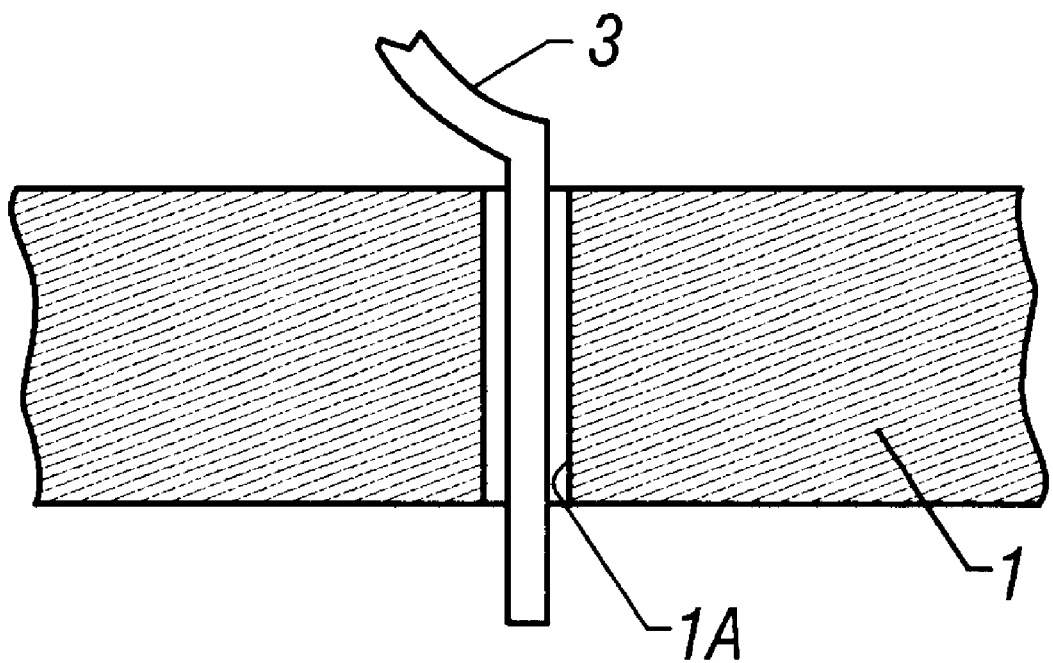
FIG. 8 is an enlarged view of the lower end section of a contact pin shown in FIG. 2.

FIG. 7 is a picked-up view of an IC socket according to a third embodiment of the present invention in reference to a positional relationship between a contact pin 3 and a solder ball B of an IC package P. In this embodiment, a protrusion 3a is formed on each contact pin 3 at a position lower than a tip of an upper end section thereof by a predetermined distance. When a cover member is closed with the upper end section of each contact pin 3 being movably inserted in its mate guide hole 2a, which is formed in a floating member 2, the floating member 2 is pushed down together with the IC package P and the tip of the upper end section of each contact pin 3 cuts into the softened solder ball B. However, since the protrusion 3a acts as a stopper, which is to be engaged with the lower border of the guide hole 2a for preventing deeper insertion of the contact pin 3 into the guide hole 2a, cut depth into the solder ball B is stayed to be within a predetermined range. The stopper of this embodiment may be constructed and arranged in any fashion as long as it can prevent the contact pin from being inserted in the floating member 2 deeper than a predetermined range, not limited to the example shown in FIG. 7 where the protrusion 3a appears along the contour of the plate surface of the contact pin; the protrusion 3a may be replaced with a single step appearing along the contour of the plate surface, or may project from the plate surface in a vertical direction.

As described above, according to the present invention, by appropriately setting a positional relationship between solder balls of an IC package to be mounted on the IC socket and the guide means arrayed in the floating member, the IC socket can maintain coplanarlity of the solder-balls properly even under the heat-resistance test or the like, or the IC socket can effectively perform wiping operation for the solder balls by using the contact pins.

In the above-described embodiments, the second surface 4b is eminent in reference to the first surface 4a on the cover member 4. However, relationship in level between the surfaces may be the reverse in accordance with thickness of the package to be contained, or, other than such cases where the surfaces are formed at different levels, the first surface and the second surface may be formed at an even level, as shown in FIG. 1B. In these alternative cases, the floating member 2 with its container section 2b is constructed such that the upper surface of the IC package P is positioned at a level higher than the top surface of the floating member 2 by a predetermined height when the IC package P is put in the container section 2b. Also, although supposed to swing for open/close operation in the foregoing descriptions of the embodiments, the cover member 4 is not limited to this type; a type which opens and closes with vertical movement is also available. Furthermore, in the second embodiment also, each type of the tip shape of the upper end section of the contact pin 3 shown in FIGS. 5A–5C is available. Still further, while the terminals of the IC package are supposed to have a ball-like shape in the foregoing descriptions of the embodiments, the IC socket of the present invention is applicable to an LGA (land grid array) type IC package.

What is claimed is:

1. An IC socket comprising:

a multitude of elastic contact pins separately constructed with one another and arranged to form an array;

a socket body through which respective lower end sections of said contact pins are inserted to be movably supported thereby;

a floating member which is vertically movably held above said socket body and by which respective upper end sections of said contact pins are movably supported; and a cover member constructed to be fitted to said floating member so as to press said floating member toward said socket body, wherein the upper end section and the lower end section of each of said contact pins are aligned to one another with intervention of an arc-shaped middle section, with an upper corner and a lower corner being formed where the upper end section and the lower end section meet the middle section, respectively, so as to limit movement of the upper end section and the lower end section with respect to said socket body and said floating member, respectively;

wherein said socket body is adapted to be fixed to a printed circuit board by fixing means so that the lower end sections of said contact pins abut on respective mate electrodes on the printed circuit board;

wherein said floating member is provided with:

a multitude of guide means for regulating the amount of projection of the upper end sections of said contact pins from said floating member in cooperation with the upper corners of said contact pins; and a container section adapted for containing an IC package by bringing a multitude of terminals of the IC package into contact with the upper end sections of said multitude of contact pins, respectively, and wherein where said cover member is fitted to said floating member and pressed down upon the IC package being put in said container section, contact at predetermined pressure is obtained between the lower end sections of said contact pins and said mate electrodes of the printed circuit board and between the upper end sections of said contact pins and the terminals of the IC package, respectively.

2. An IC socket according to claim 1, wherein said container section forms a recess in said floating member, and said cover member has a first surface to be contacted with a top surface of said floating member and a second surface to be contacted with an upper surface of the IC package which is contained in said container section, said IC socket being constructed such that said second surface is brought into contact with the upper surface of the IC package contained in said container section before said first surface is brought into contact with said top surface of said floating member in a process of said cover member being fitted in place.

3. An IC socket according to claim 1, wherein the terminals of the IC package are constructed to be solder balls, and said guide means of said floating member are arranged such that the upper end sections of said contact pins are directed toward respective centers of the solder balls.

4. An IC socket according to claim 1, wherein the tip of the upper end section of each contact pin has at least one face which is inclined in reference to a longitudinal direction of said contact pin.

5. An IC socket according to claim 1, wherein each of said contact pins has a step portion which is formed at a position lower than the tip of the upper end section of said contact pin by a predetermined distance.

6. An IC socket according to claim 1, wherein each of said guide means of said floating member forms a guide hole which is slightly tapered from a lower border to an upper border thereof.

7. An IC socket according to claim 6, wherein the lower border of said guide hole has a curved face.

* * * * *